(12) United States Patent
Hollander et al.

(10) Patent No.: US 6,911,269 B2
(45) Date of Patent: Jun. 28, 2005

(54) LEAD-FREE CHEMICAL NICKEL ALLOY

(75) Inventors: Alfons Hollander, Kerpen-Buir (DE); Heinz-Peter Becker, Kerpen (DE)

(73) Assignee: AHC Oberflachentechnik GmbH & Co., Kerpen (DE)

(*) Notice: Subject to any disclaimer, the term of this patent is extended or adjusted under 35 U.S.C. 154(b) by 5 days.

(21) Appl. No.: 10/399,464

(22) PCT Filed: Oct. 25, 2001

(86) PCT No.: PCT/DE01/04014
§ 371 (c)(1),
(2), (4) Date: Apr. 18, 2003

(87) PCT Pub. No.: WO02/34964
PCT Pub. Date: May 2, 2002

(65) Prior Publication Data
US 2004/0007472 A1 Jan. 15, 2004

(30) Foreign Application Priority Data
Oct. 25, 2000 (DE) .......................................... 100 52 960

(51) Int. Cl.[7] .................. B32B 15/01; C23C 18/32; C23C 18/36
(52) U.S. Cl. .............. 428/680; 428/675; 428/936; 427/123; 427/438; 420/441; 106/1.27
(58) Field of Search .................. 428/680, 675, 428/936; 427/438, 123; 106/1.22, 1.27; 420/441

(56) References Cited

U.S. PATENT DOCUMENTS

| | | | | |
|---|---|---|---|---|
| 2,884,344 A | * | 4/1959 | Ramirez | 427/438 |
| 3,764,380 A | * | 10/1973 | Grossman et al. | 428/550 |
| 4,483,711 A | * | 11/1984 | Harbulak et al. | 106/1.22 |
| 4,600,609 A | * | 7/1986 | Leever et al. | 427/438 |
| 4,699,811 A | * | 10/1987 | Kunces | 427/259 |
| 5,091,225 A | * | 2/1992 | Goto | 427/430.1 |
| 5,437,887 A | * | 8/1995 | Yarkosky et al. | 427/131 |
| 2003/0232148 A1 | * | 12/2003 | Shahin | 427/438 |

FOREIGN PATENT DOCUMENTS

| | | | |
|---|---|---|---|
| GB | 845648 | 8/1960 | |
| JP | 06131659 | 5/1994 | G11B/5/84 |

* cited by examiner

Primary Examiner—John J. Zimmerman
(74) Attorney, Agent, or Firm—Fish & Richardson P.C.

(57) ABSTRACT

Lead-free chemically produced nickel alloy containing nickel, phosphorus, bismuth and antimony, process for the production of such a nickel alloy by externally electroless metal deposition in an aqueous electrolyte and articles plated therewith.

17 Claims, 1 Drawing Sheet

Determination of the development of the electrochemical potential of the nickel alloy according to the invention Determination of the development of the electrochemical potential of the nickel alloy according to the invention Determination of the development of the electrochemical potential of a nickel alloy according to US 2,884,344

PRIOR ART

LEAD-FREE CHEMICAL NICKEL ALLOY

RELATED APPLICATIONS

This application claims priority from PCT/DE01/04014, filed on Oct. 25, 2001.

BACKGROUND

The present invention relates to a lead-free nickel alloy produced chemically, i.e. by an externally electroless method, a process for the production of such a nickel alloy by electroless metal deposition in an aqueous electrolyte and articles plated therewith.

The externally electroless chemical nickel plating of metal surfaces is a process for the protection of metals against corrosion which is frequently used on an industrial scale.

To achieve an improved protection against corrosion, it has proved necessary to achieve a nickel/phosphorus alloy by adding suitable compounds to the aqueous electrolyte.

Pure nickel and phosphinate-containing electrolytes for chemical nickel plating require additional stabilisers to prevent spontaneous decomposition. Stabilisation sufficient for industrial application has previously been achieved only by adding lead compounds. Stabilisers previously added as an alternative, such as molybdenum, cadmium or tin compounds, exhibit an unsatisfactory effectiveness in comparison with lead.

However, even such a modified chemical nickel layer does not satisfy the increased requirements regarding resistance to corrosion such as they exist in the electronics industry for the manufacture of printed circuits, for example.

The addition of lead, however, has the disadvantage that edge passivity can be increasingly observed when the value specified for the lead concentration is exceeded. Edge passivity means that a reduced layer structure can be observed at the edges of structural parts. This results in a reduced resistance to corrosion in the areas concerned.

This problem can be observed in particular on the inner edge areas of bores in printed circuits as a result of which the electrical properties of soldered and/or bonding joints are permanently negatively affected.

Moreover, the addition of lead is no longer tenable due to environmental considerations; the resulting presence of lead in printed circuits prevents an environmentally appropriate disposal of the corresponding printed circuit boards.

An electrolyte for the production of lead-free nickel layers produced by an externally electroless method is known from U.S. Pat. No. 2,884,344. According to the process described therein, at least two cations are added to the electrolyte which are selected from the group of antimony, arsenic and bismuth. The concentration of antimony and bismuth ions is at least 5 ppm, the ratio between antimony and bismuth being between 1:5 and 1:0.5.

The layers produced according to this process exhibit a proportion of bismuth in the nickel alloy of at least 0.5% by weight and a proportion of antimony of maximum of 0.1% by weight of all constituents of the nickel alloy, have a matt surface, exhibit a distinct inherent tensile stress and have an unsatisfactory resistance to corrosion.

SUMMARY

Figure 1:
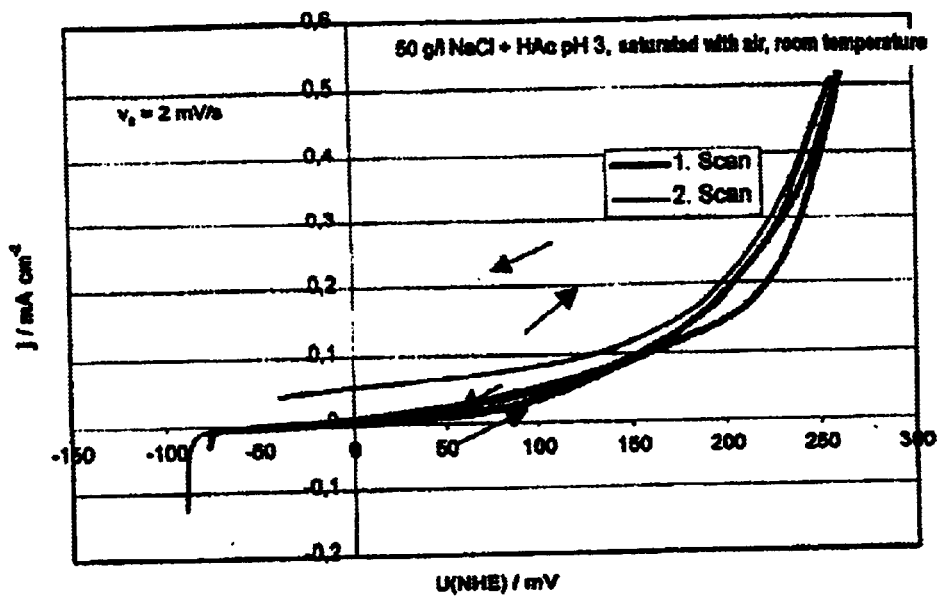
FIG. 1 depicts the electrochemical potential of the nickel alloy of this invention vis-à-vis the standard hydrogen electrode. As shown in this figure, the nickel alloy according to the invention has a positive potential.

The object of the present invention is the provision of a chemical nickel layer which contains no lead, is affected by inherent compressive stress and, at the same time, has a sufficiently high resistance to corrosion for it to be used in the electronics industry for the manufacture of printed circuits.

A further object of this invention is the provision of a process by means of which such a layer can be produced on an industrial scale without the lead-free electrolyte decomposing.

The first object is solved by way of a nickel alloy present on a metallic substrate surface, the nickel alloy, containing
nickel
phosphorus
bismuth in a proportion of maximum 0.4% by weight, and
antimony in a proportion of at least 1% by weight,
the % by weight relating to all the above-mentioned constituents of the nickel alloy, i.e. to the elements nickel, phosphorus, bismuth and antimony present in the alloy.

The term "metallic substrate surface" should be understood to mean also plastic surfaces which are first activated by means of processes known to the person skilled in the art and subsequently nickel plated.

By means of the process according to the invention it has become possible for the first time to provide a lead-free nickel alloy which, compared with conventional nickel/phosphorus layers, is affected by inherent compressive stress, has a distinctly improved resistance to corrosion and, at the same time, exhibits a high degree of gloss.

By combining bismuth and antimony, a synergistic effect is additionally achieved: an absence of antimony in the resulting nickel alloy would cause internal stresses which in turn would bring about a reduced resistance to corrosion. Without bismuth the overall stability of the electrolyte would be insufficient, a fact that would be observed by spontaneous decomposition of the electrolyte.

By combing these two elements, both the resistance to corrosion and the stability of the electrolyte are measurably increased.

A conventional layer thickness of this nickel alloy of between 2 and 50 $\mu$m is sufficient to achieve resistance to corrosion. However, layer thicknesses of more than 100 $\mu$m can also be achieved by way of suitable processes.

A layer thickness of more than 40 $\mu$m provides a stability of stage 4 of the very strong corrosion stress according to DIN 50 966. This is particularly important for plating hydraulic cylinders. All suitable materials or their alloys can be used as substrate. In view of the environmental problems connected with lead-containing nickel layers, the nickel alloy according to the invention is used in particular as protection against corrosion and diffusion barrier in the electronics industry for the manufacture of printed circuits boards.

The proportion of phosphorus in the resulting nickel alloy can be between 2 and 15% by weight of all the constituents of the nickel alloy, based on all the constituents of the nickel alloy, i.e. on the elements nickel, phosphorus, bismuth and antimony contained in the alloy formed.

The proportion of bismuth can be between 0.01 and 0.2% by weight of all the constituents of the nickel alloy.

A preferred embodiment of the nickel alloy according to the invention is obtained if the constituents nickel, phosphorus, bismuth and antimony are evenly distributed in the alloy layer. The term "evenly" means here and in the following a distribution of the corresponding elements in the nickel matrix typical of the alloy. As result of this even distribution, a homogeneous structure is achieved in the alloy so that the mechanical and electrical properties of this layer are constant even within narrow tolerance ranges, this being particularly important for the electronics industry in connection with the quality assurance which is commonly carried out in the latter.

The second object of the invention is solved by a process in which a metallic substrate is immersed into an aqueous electrolyte and the aqueous electrolyte contains nickel cations, phosphinate ions, bismuth ions in a concentration of bismuth of maximum 0.3 ppm and antimony ions in a concentration of antimony of at least 10 ppm, based on the electrolyte.

The individual process steps for the production of a chemically produced nickel alloy by externally electroless metal deposition in an aqueous electrolyte are known in principle. This applies in particular to the choice of suitable compounds for the nickel cations and phosphinate ions. Moreover, it is also known to the persons skilled in the art which additives, stabilisers, complexing agents and other additives are additionally required for a corresponding nickel alloy.

However, these parameters are not critical for the application of the process according to the invention. For this reason, this basic knowledge is not discussed in detail, reference being made instead to the text book "Funktionelle Galvanotechnik" (Functional electroplating Technology) by Wolfgag Riedel, E. Leuze Verlag.

In the process according to the invention, the proportion of nickel cations is the electrolyte can be between 79 and 97% by weight, based on the sum total of the constituents nickel, phosphorus, bismuth and antimony present in the aqueous electrolyte.

The proportion of phosphinate ions in the electrolyte can be between 2 and 15% by weight, based on the weight ratio of phosphorus to the sum total of the constituents nickel, phosphorus, bismuth and antimony present in the aqueous electrolyte.

The proportion of bismuth in the electrolyte can be between 0.01 and 0.4% by weight, in particular between 0.1 and 0.2% by weight, based on the sum total of the constituents nickel, phosphorus, bismuth and antimony present in the aqueous electrolyte; that of antimony can be between 1 and 3% by weight.

The sum total of the proportions of the components described above, which are contained in the electrolyte, is commonly 100% by weight.

According to a particularly preferred embodiment of the process according to the invention, a continuous process is involved in which, in order to maintain the desired concentration of the components concerned in the aqueous electrolyte, at least i. one solution containing the nickel cations and bismuth ions (I); and ii. one solution containing the phosphinate ions and antimony ions (II) is added to the aqueous electrolyte.

To stabilise the pH, a base in the form of a solution (III) is added to the aqueous electrolyte, which solution contains in particular ammonia and/or an alkali carbonate, in particular sodium carbonate.

Maintaining the desired concentration and/or the pH is effected by common methods known to the person skilled in the art, e.g. by using metering pumps.

Any compound can be used as suitable bismuth compound which provides a sufficient concentration of bismuth ions under the process conditions for externally electroless deposition.

Compounds of bismuth have proved particularly advantageous which are obtainable from the conversion of bismuth oxycarbonate $(BiO)_2CO_3$ with phosphonic acid, diphosphonic acid and/or sulphonic carboxylic acids with 1 to 6 carbon atoms.

Any substance can be used as antimony compound which provides a sufficient concentration of antimony cations under the process conditions. Those compounds are particularly preferred which are obtainable by converting a water-soluble antimony(III) compound with an aliphatic branched or unbranched carboxylic or hydrocarboxylic acid with 2 to 8 carbon atoms.

The invention, moreover, relates to articles which have been plated with a chemical nickel layer by means of the process according to the invention described above, in particular printed circuits boards in the electronics industry.

DETAILED DESCRIPTION

The following example serves as an illustration of the invention.

EXAMPLE 500 ml fully demineralised water are introduced into a 1 l glass beaker and the following compounds are added with stirring:

30 g nickel sulphate $(NiSO_4 * 6H_2O)$ 35 g sodium phosphinate $(NaH_2PO_2 * H_2O)$ 30 g malonic acid $(CH_2(COOH)_2)$ 30 g succinic acid $(HOOCCH_2CH_2COOH)$ 2 g toluene-4-sulphonic acid amide $(H_3C-C_6H_4-S(O)_2NH_2)$ 0.5 mg bismuth methane sulphonate $(Bi(OS(O)_2CH_3)_3)$ Subsequently, 10 ml of an aqueous solution containing 1.5 g/l antimony fluoride, 10 ml/l 50% borohydrofluoric acid $(HBF_4)$ and 100 mg/l allyl thiourea are added.

The pH is then adjusted to a value of 4.3 by adding a 25% aqueous ammonia solution and the solution is made up to 1000 ml by adding fully demineralised water.

After heating to 88° C., sheet steel sections of alloy St 37, 1 mm thick and with the dimension 50×50 mm, are suspended in the bath after the usual pre-treatment (degreasing, rinsing, activating, rinsing) for 60 minutes.

Subsequently, the sheet is rinsed and dried. The layer thickness achieved is 12 $\mu$m.

After plating, as described above, the electrolyte is maintained at operating temperature (88° C.) for a further 8 hours. No decomposition can be observed. The resistance to corrosion is determined in accordance with the provisions of DIN 50 018 KFW 0,2S (Kesternich Test).

In addition, the electrochemical potential of the resulting nickel alloy vis-à-vis the standard hydrogen electrode was determined. As shown in FIG. 1, the nickel alloy according to the invention has a positive potential.

Moreover, the internal stress of a nickel alloy thus produced (inherent tensile stress) is determined using a spiral contractometer according to Brenner/Senderoff (A. Brenner, S. Senderoff, Proc. Amer. Electropol. Soc. 35 (1948) p. 53).

To determine the proportions contained in the layer, the layer deposited is dissolved in concentrated $HNO_3$ and the individual elements are determined by atomic absorption spectroscopy.

The results of the investigations are given in the table below.

Reference Example 1

500 ml fully demineralised water are introduced into a 1 l glass beaker and the following compounds are added with stirring:

30 g nickel sulphate (NiSO$_4$*6H$_2$O)
35 g sodium phosphinate (NaH$_2$PO$_2$*H$_2$O)
30 g malonic acid (CH$_2$(COOH)$_2$)
30 g succinic acid (HOOCCH$_2$CH$_2$COOH)
2 g toluene-4-sulphonic acid amide (H$_3$C—C$_6$H$_4$—S(O)$_2$NH$_2$)
2 mg lead acetate (PB(CH$_3$COO)$_2$)
1 mg allyl thiourea Subsequently, the pH is adjusted to a value of 4.3 by adding a 25% aqueous ammonia solution and the solution is made up to 1000 ml by adding fully demineralised water.

After heating to 88° C., sheet steel sections of alloy St 37, 1 mm thick and with the dimension 50×50 mm, are suspended in the bath after the usual pre-treatment (degreasing, rinsing, activating, rinsing) for 60 minutes.

Subsequently, the sheet is rinsed and dried. The layer thickness achieved is 12 μm.

After plating, as described above, the electrolyte is maintained further at operating temperature (88° C.). The onset of decomposition is observed after only one hour. After three hours, an almost complete decomposition of the electrolyte can be observed.

Moreover, the internal stress of a nickel alloy thus produced (inherent tensile stress) is determined using a spiral contractometer according to Brenner/Senderoff (A. Brenner, S. Senderoff, Proc. Amer. Electropol. Soc. 35 (1948) p. 53).

To determine the proportions contained in the layer, the layer deposited is dissolved in concentrated HNO$_3$ and the individual elements are determined by atomic absorption spectroscopy.

The results of the investigations are given in the table below.

Reference Example 2 (in line U.S. Pat. No. 2,884,344)

In line with U.S. Pat. No. 2,884,344, 500 ml fully demineralised water are introduced into a 1 l glass beaker and the following compounds are added with stirring.

25 g nickel sulphate (NiSO$_4$*7H$_2$O)
23 g sodium phosphinate (NaH$_2$PO$_2$*H$_2$O)
8 g sodium citrate
1 g sodium tartrate
8 g sodium acetate
3.7 mg antimony(III) chloride
15.0 mg bismuth(III) chloride Subsequently, the solution is made up to 1000 ml by adding fully demineralised water. The pH of the solution is 5.1.

After heating to 95° C., sheet steel sections of alloy St 37, 1 mm thick and with the dimension 50×50 mm, are suspended in the bath after the usual pre-treatment (degreasing, rinsing, activating, rinsing) for 60 minutes.

Subsequently, the sheet is rinsed and dried. The layer thickness achieved is 13 μm.

The resistance to corrosion is determined in accordance with the provisions of DIN 50 018 KFW 0,2S (Kesternich Test).

Figure 2:
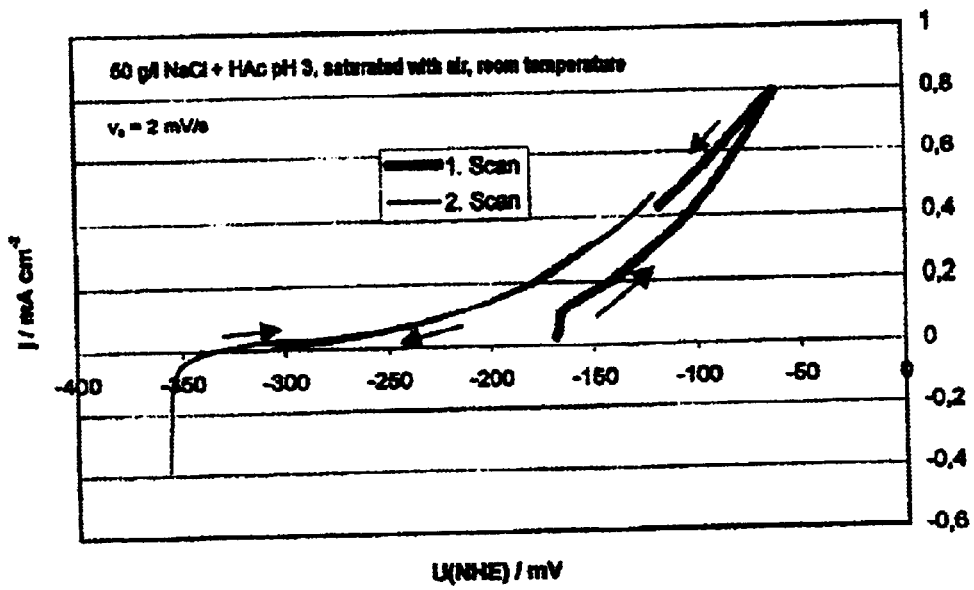
FIG. 2 depicts the electrochemical potential of the nickel alloy according to U.S. Pat. No. 2,844,344 vis-à-vis the standard hydrogen electrode. As shown in this figure, the nickel alloy according to the invention has a negative potential.

In addition, the electrochemical potential of the resulting nickel alloy according to U.S. 2,844,344 vis-à-vis the standard hydrogen electrode was determined. As shown in FIG. 2, the nickel alloy has a negative potential.

Moreover, the internal stress of a nickel alloy thus produced (inherent tensile stress) is determined using a spiral contractometer according to Brenner/Senderoff (A. Brenner, S. Senderoff, Proc. Amer. Electropol. Soc. 35 (1948) p. 53).

To determine the proportions contained in the layer, the layer deposited is dissolved in concentrated HNO$_3$ and the individual elements are determined by atomic absorption spectroscopy.

The results of the investigations are given in the following table.

TABLE

| | Example | Reference example 1 | Reference example 2 |
|---|---|---|---|
| Resistance to corrosion (in cycles) | 2 | 1 | 0 |
| Internal stress (in N/mm$^2$) | −30 | −10 | +50 |
| Ni content* | 86.5 | 87.8 | 91.6 |
| P content* | 12.1 | 12.0 | 7.6 |
| Bi content* | 0.1 | 0 | 0.7 |
| Sb content | 1.3 | 0 | 0.05 |
| Pb content* | 0 | 0.2 | 0 |

*in % by weight, based on all the elements contained in the nickel alloy

The table shows substantially improved properties of the nickel alloy according to the invention compared with the nickel layers of the state of the art.

What is claimed is:

1. A lead-free nickel alloy present on a metallic substrate surface, containing;
   nickel;
   phosphorus;
   bismuth in a proportion of maximum 0.4% by weight; and
   antimony in a proportion of at least 1% by weight, based on all the constituents of the nickel alloy.

2. The nickel alloy according to claim 1 wherein the proportion of phosphorus is between 2 and 15% by weight of all the constituents of the nickel alloy.

3. The nickel alloy according to claim 1 wherein the proportion of bismuth is between 0.01 and 0.2% by weight of all the constituents of the nickel alloy.

4. The nickel alloy according to claim 1 wherein the proportion of antimony is between 1 and 3% by weight of all the constituents of the nickel alloy.

5. The nickel alloy according to claim 1 wherein the constituents nickel, phosphorus, bismuth and antimony are evenly distributed in the nickel alloy.

6. A process for the production of a lead-free nickel alloy according to claim 1, wherein a metallic substrate is immersed into an aqueous electrolyte which contains nickel cations, phosphinate ions, bismuth ions at a concentration of bismuth of maximum 0.3 ppm and antimony ions a concentration of antimony of at least 10 ppm, the proportion of bismuth is between 0.01 and 0.4% by weight, and the proportion of antimony is between 1 and 3% by weight, based on the sum total of the constituents nickel, phosphorus, bismuth and antimony present in the aqueous electrolyte.

7. The process according to claim 6 wherein the proportion of nickel cations in the electrolyte is between 79 and 97% by weight, based on the sum total of the constituents nickel, phosphorus, bismuth and antimony present in the aqueous electrolyte.

8. The process according to claim 6 wherein the proportion of phosphinate ions in the electrolyte is between 2 and 15% by weight, based on the weight ratio of phosphorus to the sum total of the constituents nickel, phosphorus, bismuth and antimony present in the aqueous electrolyte.

9. The process according to claim 6 wherein the proportion of bismuth is between 0.1 and 0.2% by weight, based on the sum total of the constituents nickel, phosphorus, bismuth and antimony present in the aqueous electrolyte.

10. The process according to claim 6 wherein the proportion of the constituents contained in the electrolyte together amount to 100% by weight.

11. The process according to claim 6 wherein it is a continuous process in which, in order to maintain the desired concentration of the components concerned in the aqueous electrolyte, at least one solution containing the nickel cations and bismuth ions (I), and one solution containing the phosphinate ions and antimony ions (II) are added to the aqueous electrolyte.

12. The process according to claim 11 wherein an additional solution (III) containing ammonia and/or alkali carbonate, in particular sodium carbonate, is added to the aqueous electrolyte.

13. The process according to claim 6 wherein the bismuth ions originate from a compound obtainable from the conversion of ~bismuth oxycarbonate $(BiO)_2CO_3$ with phosphonic acid, diphosphonic acid and/or ulphonic carboxcylic acids with 1 to 6 carbons atoms.

14. Process according to claims 6 wherein the antimony ions originate from a compound obtainable by the conversion of a water-soluble antimony(III) compound with an aliphatic branched or unbranched carboxylic or hydrocarboxcylic acid with 2 to 8 carbon atoms.

15. An article with a nickel alloy obtainable according to claim 6.

16. The article according to claim 15 wherein it is a printed circuit board for the electronics industry.

17. The nickel alloy according to claim 2 wherein the proportion of bismuth is between 0.01 and 0.2% by weight of all the constituents of the nickel alloy.

* * * * *